United States Patent
Okai

(10) Patent No.: US 7,785,994 B2
(45) Date of Patent: Aug. 31, 2010

(54) ION IMPLANTATION METHOD AND SEMICONDUCTOR DEVICE MANUFACTURING METHOD

(75) Inventor: Hideki Okai, Niigata (JP)

(73) Assignee: Panasonic Corporation, Osaka (JP)

( * ) Notice: Subject to any disclaimer, the term of this patent is extended or adjusted under 35 U.S.C. 154(b) by 143 days.

(21) Appl. No.: 12/180,182

(22) Filed: Jul. 25, 2008

(65) Prior Publication Data

US 2009/0029535 A1 Jan. 29, 2009

(30) Foreign Application Priority Data

Jul. 25, 2007 (JP) ............... 2007-193354

(51) Int. Cl.
*H01L 21/425* (2006.01)
(52) U.S. Cl. .................. 438/525; 438/231; 438/275
(58) Field of Classification Search ............... 438/231, 438/275, 514, 525
See application file for complete search history.

(56) References Cited

U.S. PATENT DOCUMENTS

| | | | |
|---|---|---|---|
| 6,040,208 A * | 3/2000 | Honeycutt et al. ......... 438/229 |
| 6,319,762 B1 * | 11/2001 | Liaw et al. .................. 438/231 |
| 6,614,033 B2 * | 9/2003 | Suguro et al. ............ 250/491.1 |
| 2002/0155657 A1 * | 10/2002 | Ikeda et al. ................ 438/238 |
| 2008/0096359 A1 | 4/2008 | Gupta et al. |

FOREIGN PATENT DOCUMENTS

JP 2002-026274 1/2002

* cited by examiner

*Primary Examiner*—Phuc T Dang
(74) *Attorney, Agent, or Firm*—McDermott Will & Emery LLP

(57) ABSTRACT

In the ion implantation method and semiconductor device manufacturing method relating to the present invention, a disc on which multiple semiconductor substrates are mounted is positioned in the manner that a first angle $\beta_1$ is made between an X-Y plane perpendicular to an ion beam and a line perpendicular to the Y-axis in a disc rotation plane. In this state, an ion beam is emitted to implant a first conductivity type impurity in the semiconductor substrates while the disc is rotated about a disc rotation axis. Then, the disc is positioned in the manner that a second angle $\beta_2$ is made between the X-Y plane and a line perpendicular to the Y-axis in the disc rotation plane. In this state, an ion beam is emitted to implant a second conductivity type impurity in the semiconductor substrates while the disc is rotated about the disc rotation axis.

14 Claims, 16 Drawing Sheets

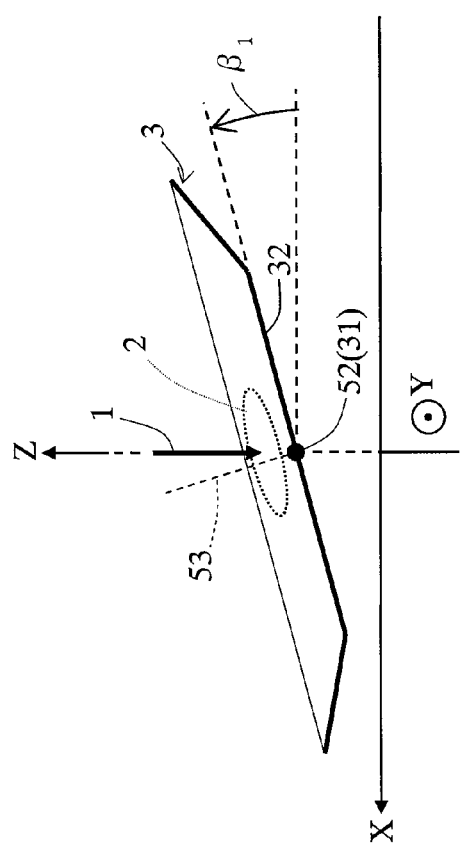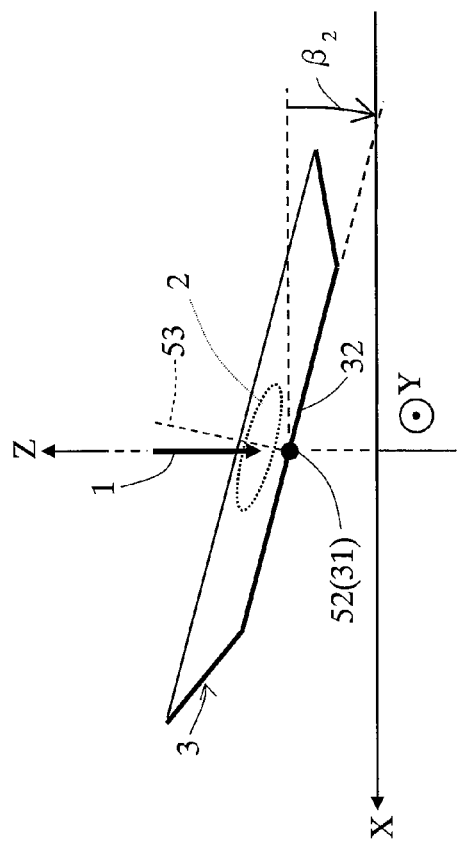

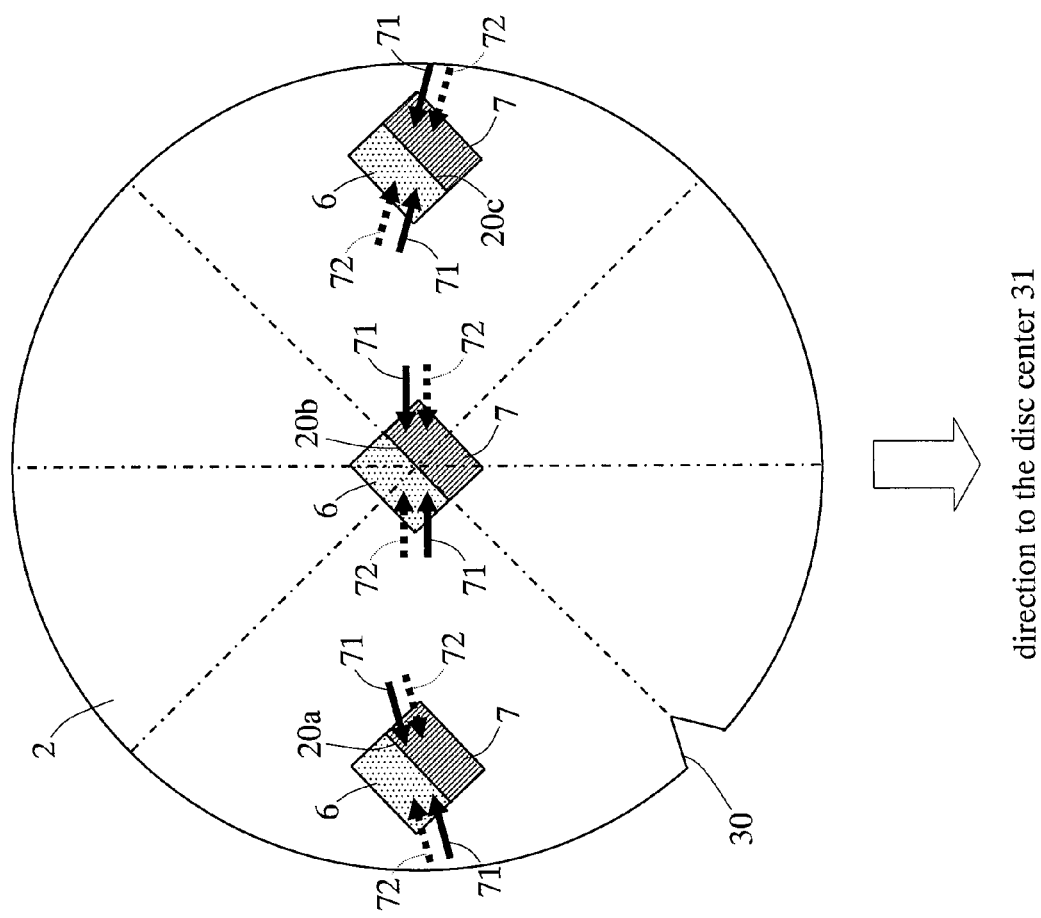

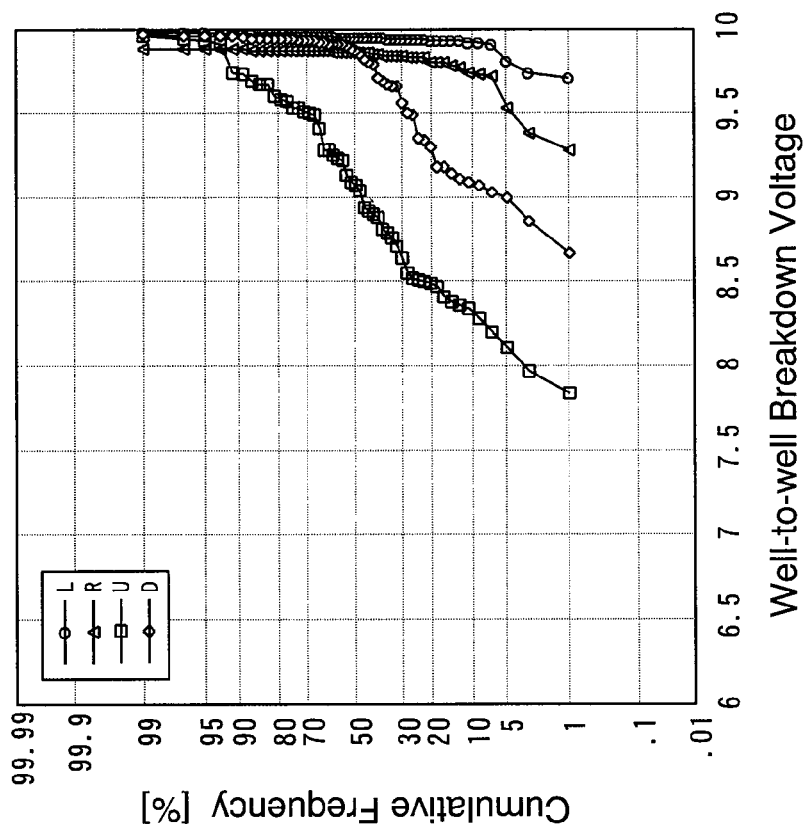

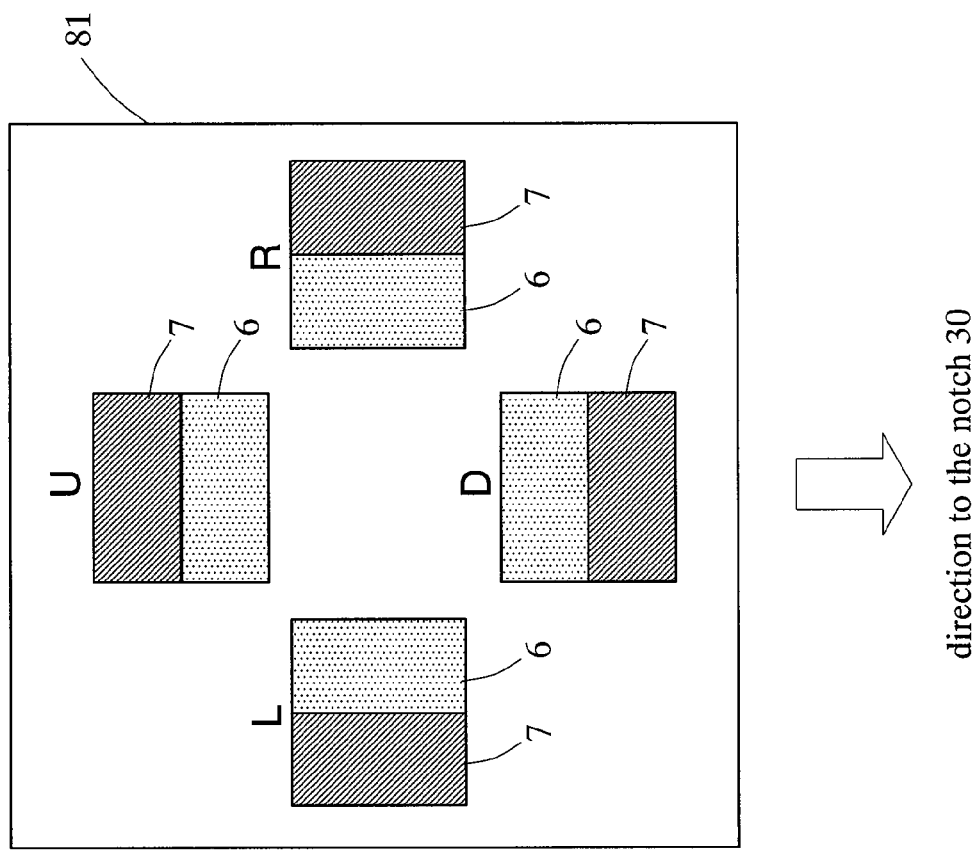

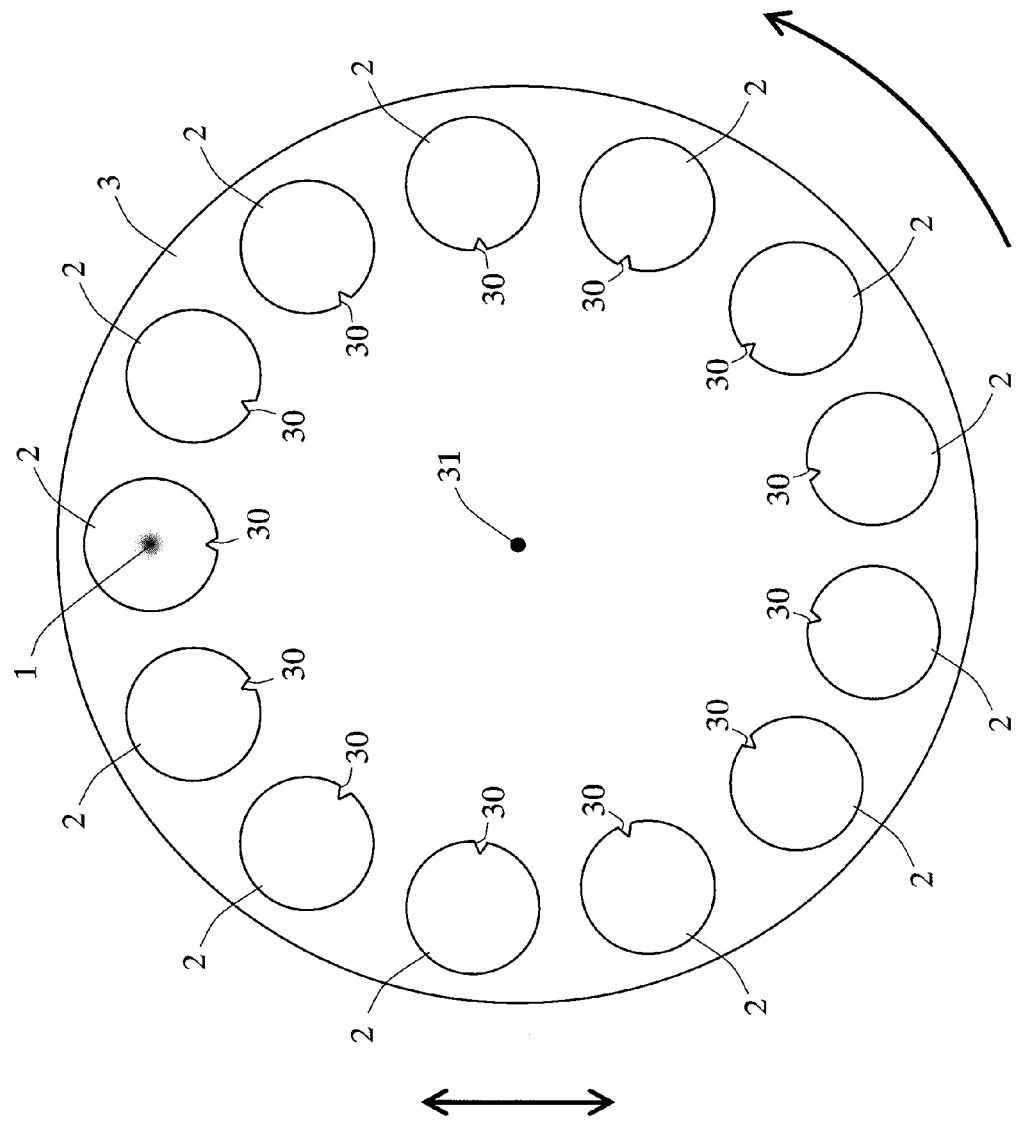

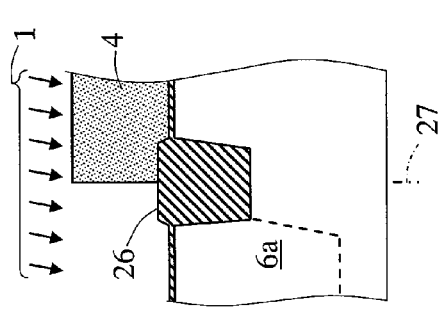
Fig. 15A (PRIOR ART)
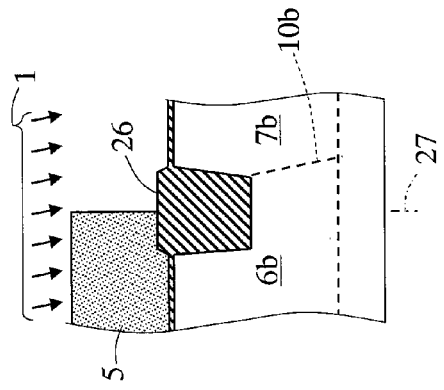
Fig. 15D (PRIOR ART)
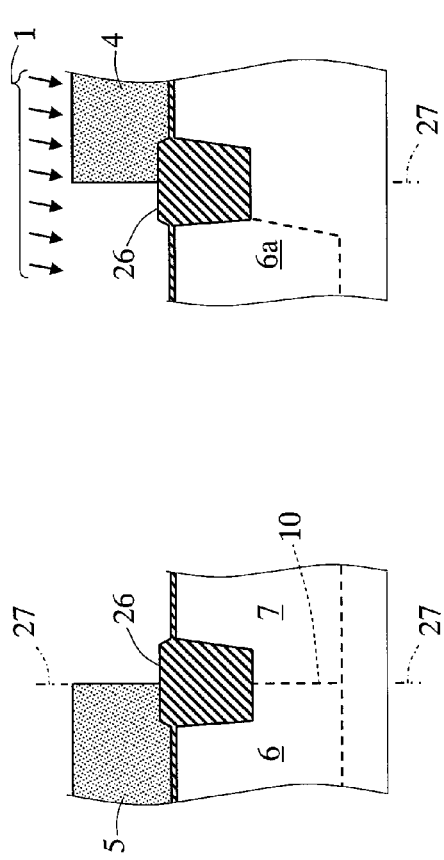
Fig. 15B (PRIOR ART)
Fig. 15E (PRIOR ART)
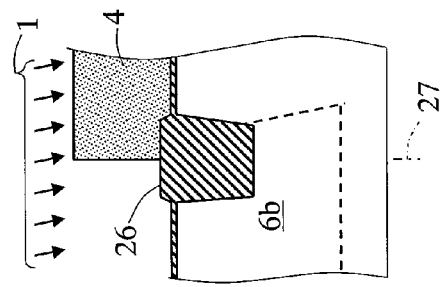
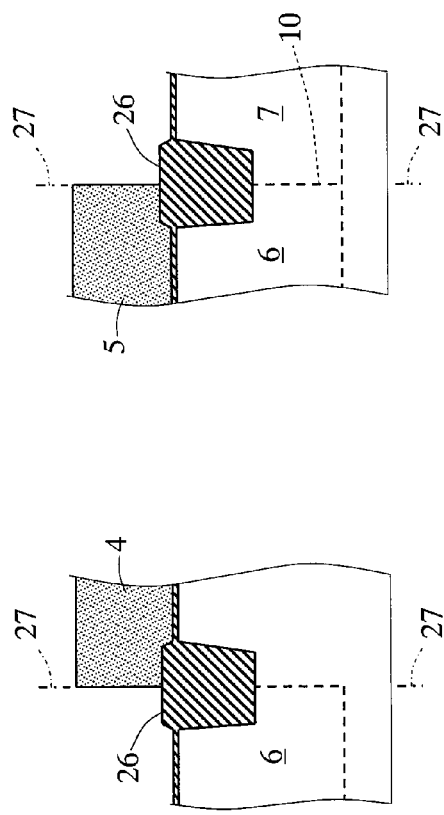
Fig. 15C (PRIOR ART)
Fig. 15F (PRIOR ART)
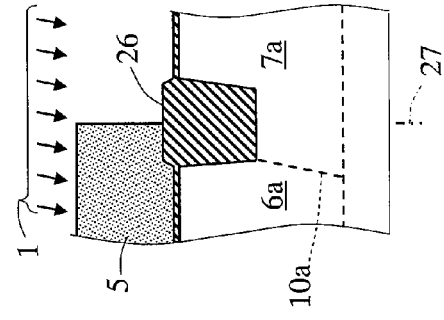

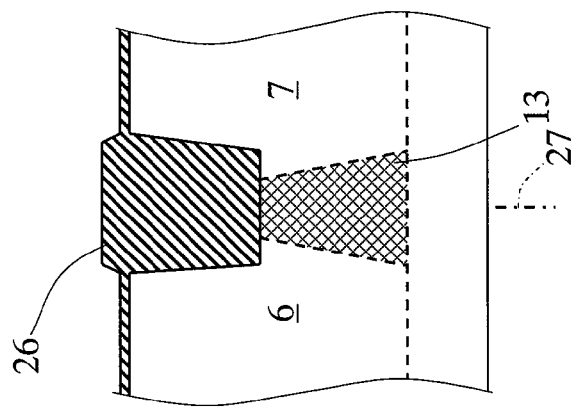
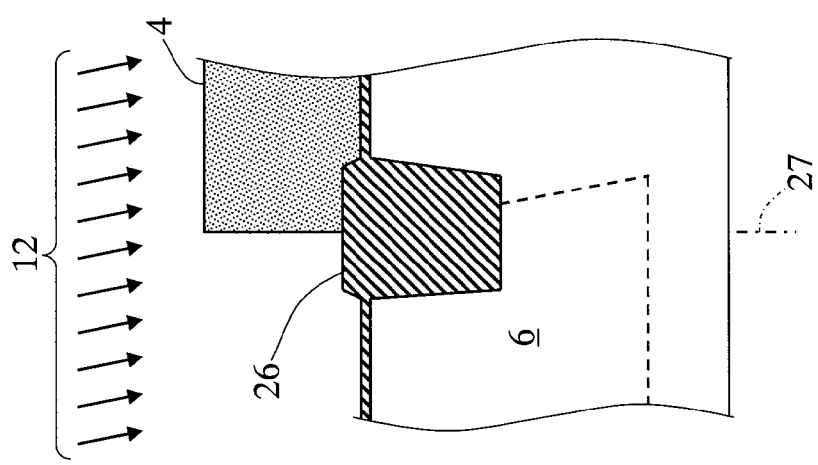
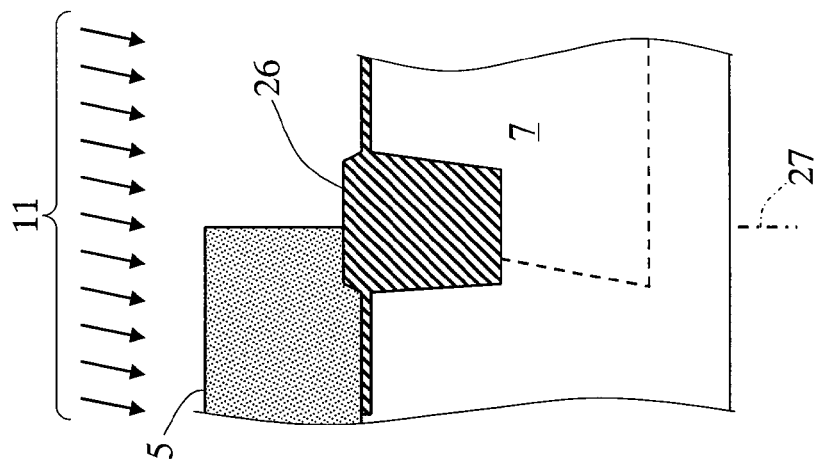

ION IMPLANTATION METHOD AND SEMICONDUCTOR DEVICE MANUFACTURING METHOD

CROSS-REFERENCE TO RELATED APPLICATION

The present application claims the benefit of Japanese Patent Application No. 2007-193354 filed Jul. 25, 2007, the subject matter of which is incorporated herein by reference.

BACKGROUND OF THE INVENTION

1. Field of the Invention

The present invention relates to an ion implantation method and semiconductor device manufacturing method using a batch processing ion implantation apparatus and relates particularly to an ion implantation method and semiconductor device manufacturing method by which variation in breakdown voltage of the well region boundary formed below an element isolation region is prevented.

2. Description of the Related Art

Ion implantation is extensively used in manufacturing semiconductor integrated circuits. Both N and P wells are generally created by ion implantation. Ion implantation is classified into two categories: the batch processing system and the single wafer processing system. In the batch processing system, impurity ions are implanted in multiple semiconductor substrates at a time. In the single wafer processing system, impurity ions are implanted in a single semiconductor substrate at a time. Thus, the ion implantation apparatus is classified into two types: the batch processing ion implantation apparatus and the single wafer processing ion implantation apparatus. They have different structures.

FIG. 13 is an illustration schematically showing a disc (a plate-shape support) provided in the batch processing ion implantation apparatus. As shown in FIG. 13, a disc 3 is rotatable about the disc rotation axis passing through the center 31 of the disc 3. Multiple semiconductor substrates 2 are mounted in an annular form around the rotation axis (center 31) of the disc 3.

For ion implantation, the disc 3 is rotated at a speed of 1,000 rpm or higher and an ion beam 1 is emitted to the disc 3. The ion beam 1 is a cluster of impurity ions accelerated in a specific direction (injection direction) to be implanted in the semiconductor substrates 2. In this type of ion implantation apparatus, the ion beam 1 is not scanned (deflected), having a fixed irradiation point. Therefore, impurity ions are implanted in the semiconductor substrates 2 when the semiconductor substrates 2 reach the irradiation point of the ion beam 1 while the disc 3 rotates. In FIG. 13, the ion beam 1 irradiates the semiconductor substrate 2 at the uppermost position in the figure.

The disc 3 is movable in a plane perpendicular to the ion beam 1 in a diameter direction of the disc 3. For example, in the ion implantation apparatus in which the ion beam 1 is emitted horizontally, the entire disc 3 can move vertically. Impurity ions are implanted uniformly in the entire surface of the semiconductor substrate 2 while the disc 3 rotates and linearly reciprocates across a diameter of the semiconductor substrate 2 in conjunction with the ion beam 1.

The batch processing ion implantation apparatus as described above is used for medium to large ion current (implantation dose rate) regions. More specifically, it is used for well implantation, drain extension implantation, high concentration impurity implantation in gate electrodes and high concentration impurity implantation for source and drain regions. The semiconductor substrates 2 in FIG. 13 have a notch 30 indicating a crystal surface orientation of the semiconductor substrate 2. In FIG. 13, the semiconductor substrates 2 are placed on the disc 3 with the notch 30 directed to the center 31, whereby the semiconductor substrates 2 are directed in the same manner when they reach the irradiation position of the ion beam 1.

On the other hand, FIG. 14 is an illustration schematically showing a relationship between the ion beam 1 and semiconductor substrate 2 during ion implantation in the single wafer processing ion implantation apparatus. In FIG. 14, the ion beam 1 is emitted horizontally. A single semiconductor substrate 2 is placed in the single wafer processing ion implantation apparatus shown in FIG. 14. The ion beam 1 is scanned on the semiconductor substrate 2 by the vertical magnetic field generated by magnets 41.

In the case of FIG. 14, the semiconductor substrate 2 is placed on a substrate support (not shown) that is movable in a diameter direction of the semiconductor substrate 2 (for example vertically). The horizontal scanning of the ion beam 1 and the vertical reciprocal movement of the semiconductor substrate 2 allow impurity ions to be implanted uniformly in the entire surface of the semiconductor substrate 2.

The single wafer processing ion implantation apparatus as described above is often used for small to medium ion current regions. More specifically, it is used for well implantation, pocket implantation for MOS transistor source and drain regions and implantation for threshold voltage control.

Generally, impurity ions implanted example in a single crystal silicon semiconductor substrate should be inhibited to reach deep inside the semiconductor substrate by channeling in the ion implantation process. To this end, the ion beam 1 is emitted at an angle in relation to the normal line of the surface of the semiconductor substrate 2. The semiconductor substrate 2 is held on the disc 3 or a substrate support in the manner that the ion beam 1 enters the semiconductor substrate 2 at an angle in relation to the normal line of the surface thereof in either type of ion implantation apparatus although this is not shown in detail in FIGS. 13 and 14.

In a conventional CMOS semiconductor integrated circuit device, the semiconductor substrate 2 has N and P wells. These wells are formed using the above described batch processing or single wafer processing ion implantation apparatus. In the up-to-date semiconductor integrated circuit device, MOS transistors are provided at a high density. The boundary between N and P wells is often formed in the semiconductor region below a fine element isolation region.

FIG. 15A is a cross-sectional view showing an ideal boundary between N and P wells (well boundary) formed in the semiconductor region below an element isolation region. In the case of FIG. 15A, the element isolation region has an STI (shallow trench isolation) structure consisting of an insulator such as a silicon oxide film embedded in a trench formed in the semiconductor substrate surface. In order to form a well boundary in the semiconductor region below an STI structure 26, a resist pattern 4 having an opening edge at the center 27 of the STI structure is used as an ion implantation mask as shown in FIG. 15A. In other words, for the ion implantation to form an N well 6, a resist pattern 4 having an opening above the region to be an N well 6 and the opening edge at the center 27 of the STI structure 26 is formed. As N type impurity ions are implanted using the resist pattern 4 as a mask, the ions partly pass through the STI structure 26 and form an N well 6 also in the semiconductor region below the STI structure 26. Similarly, in order to form a P well 7, P type impurity ions are implanted using as an ion implantation mask a resist pattern 5 having an opening above the region to be a P well 7 and the opening edge at the center 27 of the STI structure 26 as shown in FIG. 15B. In this way, the ions partly pass through the STI structure 26 and form a P well 7 also in the semiconductor region below the STI structure 26.

The N and P wells 6 and 7 formed as described above are symmetric about the center 27 of the STI structure 26. Consequently, the well boundary 10 is formed at the center 27 of the STI structure 26. The above well implantation is performed at a high implantation energy level that allows for transmission through the STI structure 26. Therefore, the N and P wells 6 and 7 are so-called retrograde wells with which the impurity concentration is higher in the inside than in the surface part of a semiconductor substrate.

This is the ideal well boundary. As described above, in the actual ion implantation, the ion beam 1 enters the semiconductor substrate 2 at an angle in relation to the normal line of the surface of the semiconductor surface 2. Therefore, when the N well forming resist pattern 4 is formed and the ion beam 1 is emitted for example in a direction tilted to the resist pattern 4, a part of the semiconductor region below the STI structure 26 is in the shadow of the resist pattern 4. In such a case, no N type impurity layer is formed in the semiconductor region in the shadow of the resist pattern 4 as an N well 6a shown in FIG. 15C. In this state, when P type impurity ions are implanted at the same injection angle as the ion beam 1 of FIG. 15C using the P well forming resist pattern 5 as a mask, a P well 7a is formed also in the semiconductor region below the resist pattern 5 as shown in FIG. 15D. In this case, the well boundary 10a is not formed at the center 27 of the STI structure 26.

Conversely, when the N well forming resist pattern 4 is formed and the ion beam 1 is emitted in a direction tilted away from the resist pattern 4, an N well 6b is formed also in the semiconductor region below the resist pattern 4 as shown in FIG. 15E. In this state, when P type impurity ions are implanted at the same injection angle as the ion beam 1 of FIG. 15E using the P well forming resist pattern 5 as a mask, a P well 7b is formed as shown in FIG. 15F; no P type semiconductor layer is formed in the semiconductor region in the shadow of the resist pattern 5. Also in this case, the well boundary 10b is not formed at the center 27 of the STI structure 26.

It is known that the ability of the well to isolate the elements or a well-to-well breakdown voltage of the well boundary is decreased when the well boundary is not formed at the center 27 of the STI structure 26. The decrease in the well-to-well breakdown voltage is more apparent as the width of the STI structure 26 (the transverse width of the STI structure in FIGS. 15A to 15F) is reduced.

In order to resolve the above problem, the Japanese Laid-Open Patent Publication No. 2002-26274 discloses a technique to prevent the decrease in the well-to-well breakdown voltage. FIGS. 16A to 16C are cross-sectional views showing the process of the ion implantation technique disclosed in the prior publication. In this technique, as shown in FIGS. 16A and 16B, the injection direction of an ion beam 11 for forming a P well 7 and the injection direction of an ion beam 12 for forming an N well 6 are opposite to each other about the center 27 of the STI structure 26. In such a case, as shown in FIG. 16C, the N well 6 and P well 7 nearly electrically compensate with each other in a region 13 where they overlap and the well boundary is formed substantially at the center 27 of the STI structure 26. Consequently, the decrease in the well-to-well breakdown voltage can be prevented. Furthermore, the prior publication proposes a technique in which ion implantation for forming a P well and ion implantation for forming an N well are each performed in four directions in a symmetric manner. Then, the dependency of the well-to-well breakdown voltage on the well boundary forming direction is reduced and a high well-to-well breakdown voltage can be obtained in any perpendicular directions on the semiconductor substrate.

SUMMARY OF THE INVENTION

The technique disclosed in the prior publication is preferable for the single wafer processing ion implantation apparatus in which the semiconductor substrate 2 is relatively easily rotated about the center of the semiconductor substrate 2. However, it is not easy to apply the technique disclosed in the prior publication to the batch processing ion implantation apparatus in which the semiconductor substrates 2 are not easily rotated about the center of the semiconductor substrate 2.

The semiconductor substrates 2 can be rotated in the batch processing ion implantation apparatus by changing the position of the notch 30 when the semiconductor substrates 2 are placed on the disc 3. However, the ion beam 1 is emitted to the disc 3 rotating at a high speed and carrying multiple semiconductor substrates 2 in the batch processing ion implantation apparatus as described above. In such a case, the ion beam 1 is injected in different directions depending on the position on the semiconductor substrates 2. Then, it is impossible to inject the ion beam 1 in symmetric directions simply by changing the notch position of the semiconductor substrate 2 to rotate it on the disc 3 in the batch processing ion implantation apparatus. Hence, it is significantly difficult to inject the ion beam for forming a P well and the ion beam for forming an N well in opposite directions to each other about the center 27 of the STI structure 26 in the batch processing ion implantation apparatus under the circumstances where no specific technique is known.

Furthermore, when the well boundaries are formed below element isolation regions in the batch processing ion implantation apparatus, unlike the single wafer processing ion implantation apparatus, a problem occurs that values of the well-to-well breakdown voltage vary among the well boundaries formed in the same direction on a semiconductor substrate. In other words, the well boundary formed at a specific position on the semiconductor substrate 2 has a lower well-to-well breakdown voltage. This phenomenon occurs because the ion beam 1 is injected in the semiconductor substrate 2 in different directions depending on the position on the semiconductor substrate 2 in the batch processing ion implantation apparatus.

The semiconductor substrate is irradiated with the ion beam of short duration because the semiconductor substrate is rotated at a high speed during the ion implantation in the batch processing ion implantation apparatus. Thus, the substrate temperature is not elevated during the high energy implantation such as well implantation. In addition, multiple semiconductor substrates can simultaneously be treated for ion implantation, leading to high throughput. Because of these advantages, the batch processing ion implantation apparatus deems to be used even if design rules of the semiconductor process are further downsized in the future. Therefore, a technique to improve the well-to-well breakdown voltage that is easily applicable to the batch processing ion implantation apparatus is in demand.

The present invention is proposed in view of the above prior art circumstances and the purpose of the present invention is to provides an ion implantation method and semiconductor device manufacturing method by which decrease in the well-to-well breakdown voltage of the well boundary formed in the batch processing ion implantation apparatus is prevented.

In order to resolve the above problem, the present invention utilizes the following technical means. First, the present invention is premised upon an ion implantation method for emitting an ion beam to implant impurities in multiple semiconductor substrates while a plate-shape support on which multiple semiconductor substrates are mounted in an annular form around a rotation center is rotated about the rotation center. In the ion implantation method of the present invention, the support on which multiple semiconductor substrates are mounted is positioned in a first state in which a first angle is made between a plane perpendicular to an ion beam injection direction and a line perpendicular to a line passing through an ion beam irradiation point and the rotation center in a rotation plane of the support. In this first state, the support is rotated about the rotation center and an ion beam is emitted to implant a first conductivity type impurity in the semiconductor substrates. Then, the support on which multiple semiconductor substrates are mounted is positioned in a second state in which a second angle is made between the plane perpendicular to the ion beam injection direction and the line perpendicular to the line passing through the ion beam irradiation point and the rotation center in the rotation plane of the support. In this second state, the support is rotated about the rotation center and an ion beam is emitted to implant a second conductivity type, which is the conductivity type opposite to the first conductivity type, impurity in the semiconductor substrates.

In the above ion implantation method, an ion beam can further be emitted to implant the second conductivity type impurity in the semiconductor substrates while the support is rotated about the rotation center in the above first state and an ion beam can be emitted to implant the first conductivity type impurity in the semiconductor substrates while the support is rotated about the rotation center in the above second state.

On the other hand, in another aspect, the present invention provides a semiconductor device manufacturing method for emitting an ion beam to form impurity layers in multiple semiconductor substrates while a plate-shape support on which multiple semiconductor substrates are mounted in an annular form around a rotation center is rotated about the rotation center. In the semiconductor device manufacturing method of the present invention, first, a first mask pattern having an opening over a region in which a first impurity layer is formed on the semiconductor substrate having an element isolation region consisting of an insulation material is formed. The opening edge of the first mask pattern is positioned on the element isolation region. Multiple semiconductor substrates each having the first mask pattern are mounted on the support. The support is positioned in a first state in which a first angle is made between a plane perpendicular to an ion beam injection direction and a line perpendicular to a line passing through an ion beam irradiation point and the rotation center in a rotation plane of the support. In this first state, the support is rotated about the rotation center and an ion beam is emitted to implant a first conductivity type impurity in the semiconductor substrates. Then, a second mask pattern having an opening over a region in which a second impurity layer is formed on the semiconductor substrate is formed. The opening edge of the second mask pattern is positioned on the element isolation region. Multiple semiconductor substrates each having the second mask pattern are mounted on the support. The support is positioned in a second state in which a second angle is made between the plane perpendicular to the ion beam injection direction and the line perpendicular to the line passing through the ion beam irradiation point and the rotation center in the rotation plane of the support. In this second state, the support is rotated about the rotation center and an ion beam is emitted to implant a second conductivity type, which is the conductivity type opposite to the first conductivity type, impurity in the semiconductor substrates.

In the above ion implantation method, an ion beam can further be emitted to implant the first conductivity type impurity in the semiconductor substrates while the support on which multiple semiconductor substrates each having the first mask pattern are mounted is rotated about the rotation center in the above second state. In such a case, an ion beam is emitted to implant the second conductivity type impurity in the semiconductor substrates while the support on which multiple semiconductor substrate each having the second mask pattern are mounted is rotated about the rotation center in the above first state.

In the semiconductor device manufacturing method having the above configuration, the first and second angles can be angles at which the rotation plane of the support is positioned symmetrically about the plane containing the ion beam and rotation center. Furthermore, the first and second impurity layers can be wells. It is preferable that each semiconductor substrate is mounted on the support in a manner that an angle of 45° is made between a line passing through a center and notch of the semiconductor substrate and a line passing through the center of the semiconductor substrate and the rotation center of the support. Additionally, a boundary between the first and second impurity layers formed on the semiconductor substrate surface can be parallel to or perpendicular to a line passing through the center and notch of the semiconductor substrate. The above configuration is particularly preferable when the element isolation region has a width of 130 nm or smaller in the direction perpendicular to the boundary between the first and second impurity layers.

In the present invention, a symmetric well boundary can easily be formed in an element isolation region when N and P wells having the boundary below the element isolation region are formed. Therefore, variation in the well-to-well breakdown voltage on the semiconductor substrate surface can be reduced and deterioration in the well-to-well breakdown voltage can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A and 8B are schematic illustrations showing a movement of a disc in an embodiment relating to the present invention.

FIG. 9 is a schematic illustration showing an ion beam injection direction in an embodiment of the present invention.

FIGS. 11A and 11B are graphical representations showing values of the well-to-well breakdown voltage.

FIG. 12 is a plane view showing a measuring pattern.

FIG. 13 is an illustration showing a positional relationship between a disc and semiconductor substrates in a batch processing ion implantation apparatus.

FIGS. 15A to 15F are cross-sectional views schematically showing a well boundary.

FIGS. 16A to 16C are cross-sectional views showing prior art process steps to form a well boundary.

DETAILED DESCRIPTION OF PREFERRED EMBODIMENT

The inventor of this application has reviewed the factors of deterioration in a well-to-well breakdown voltage that occurs when N and P wells are formed below an element isolation region in the batch processing ion implantation apparatus. These factors will be described hereafter before the description of an embodiment.

As described above, in a batch processing ion implantation apparatus, the ion beam 1 is emitted to the disc 3 while the disc 3 on which multiple semiconductor substrates 2 are mounted is rotated about the disc rotation axis at a high speed. Also in the batch processing ion implantation apparatus, impurity ions should be injected at a specific angle (hereafter, referred to as a tilt angle) in relation to the normal line of the main surface of the semiconductor substrate and at a specific rotational angle (hereafter, referred to as a twist angle) for inhibiting channeling.

Figure 1:
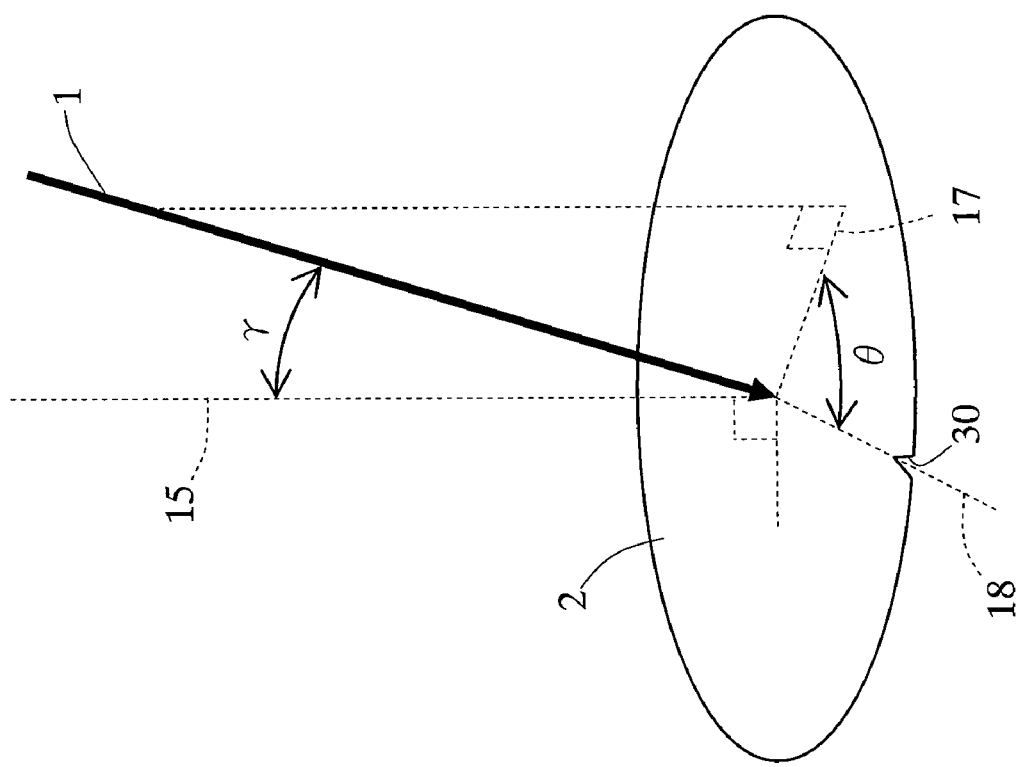
FIG. 1 is a perspective view showing an ion beam entering a semiconductor substrate.

FIG. 1 is a perspective view showing the ion beam 1 entering the semiconductor substrate 2. As shown in FIG. 1, the tilt angle $\gamma$ is an angle between a normal line 15 of the surface of the semiconductor substrate 2 and the ion beam 1. The twist angle $\theta$ is an angle between a projected line 17 of the ion beam 1 on the semiconductor substrate 2 and a line 18 passing through a center and the notch 30 of the semiconductor substrate 2. For some element patterns formed on the semiconductor substrate 2, the ion implantation is performed with a specific twist angle $\theta$ for inhibiting channeling.

Figure 2:
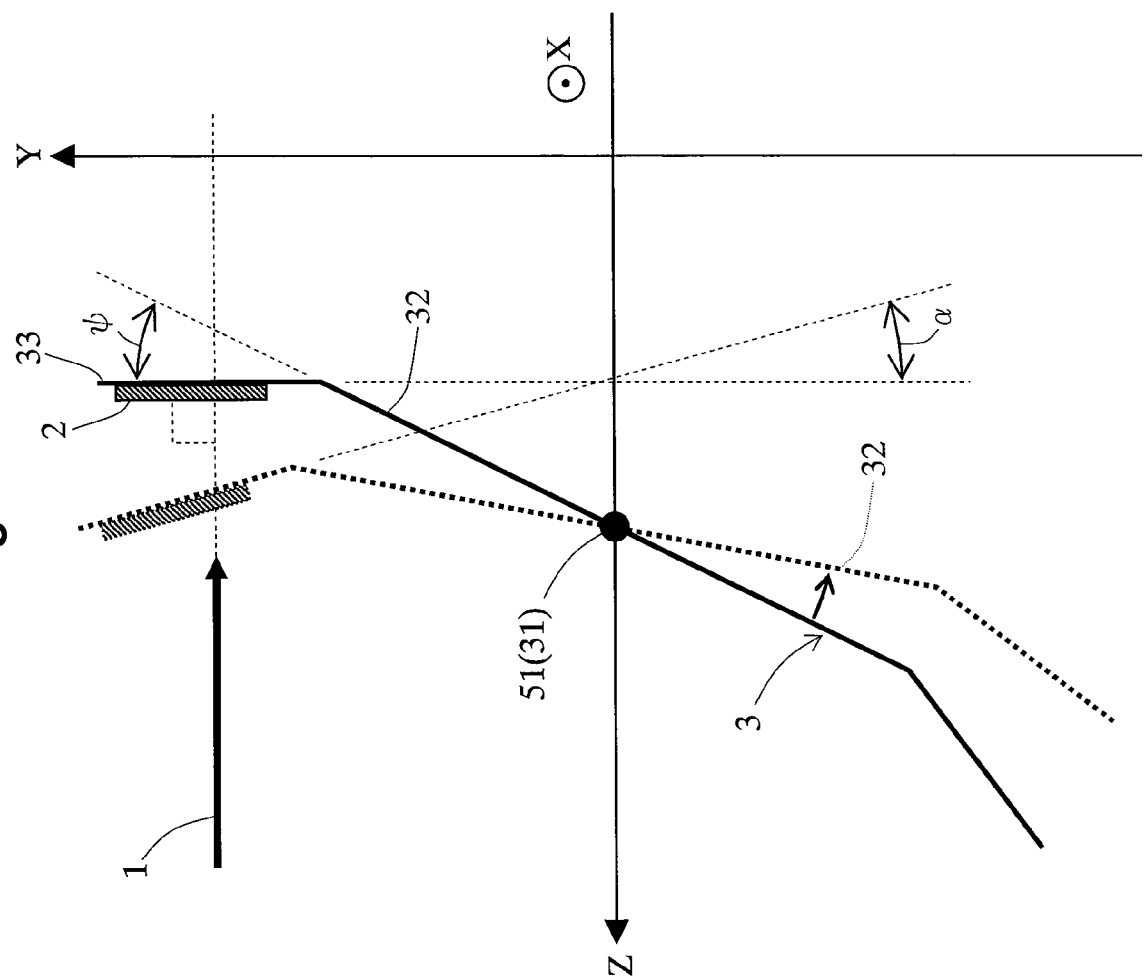
FIG. 2 is a vertical cross-sectional view of a disc.
Figure 3:
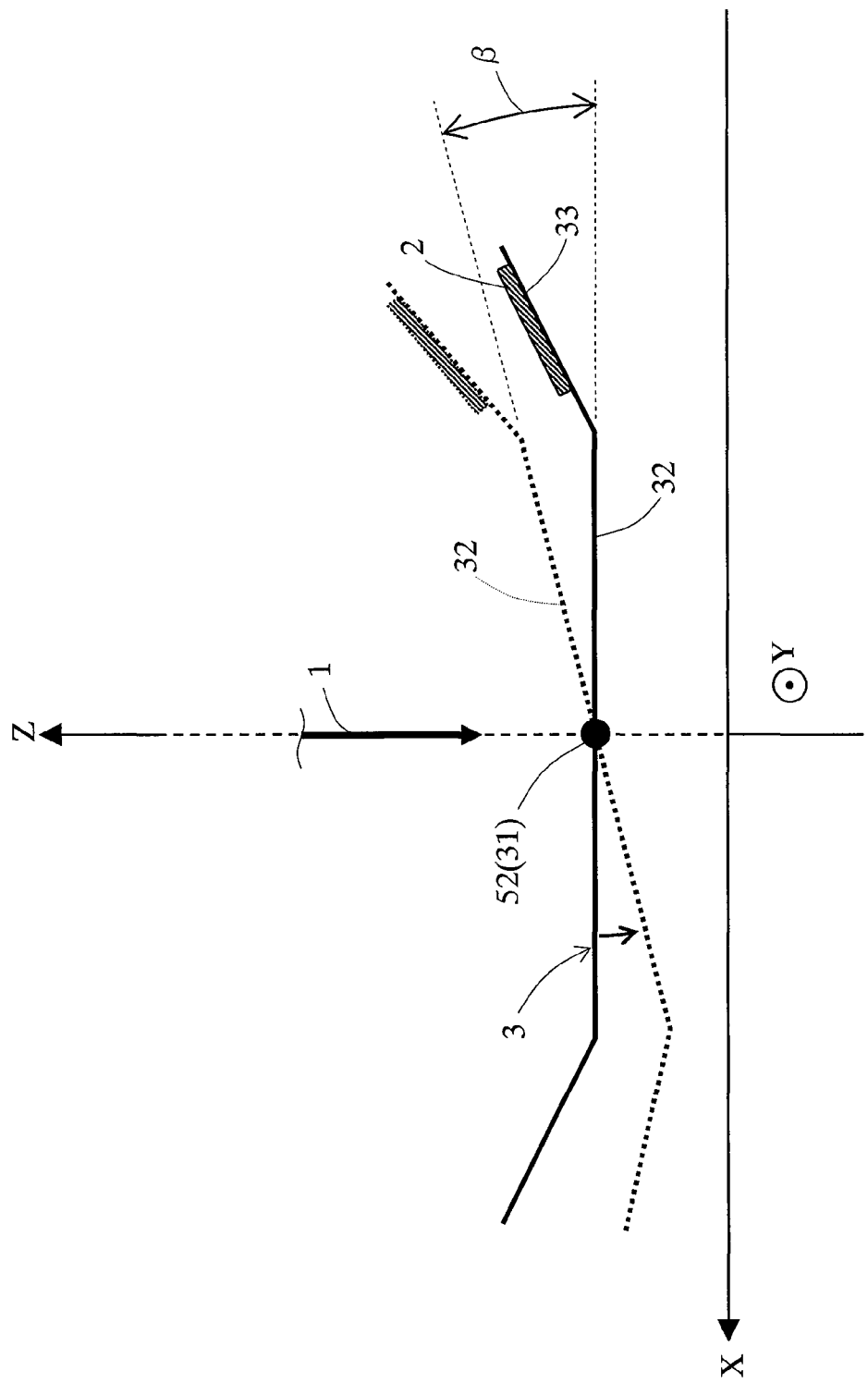
FIG. 3 is a horizontal cross-sectional view of a disc.

The tilt angle $\gamma$ and twist angle $\theta$ in the batch processing ion implantation apparatus are determined as follows. FIG. 2 is a vertical cross-sectional view of the disc 3 shown in FIG. 13. FIG. 3 is a horizontal cross-sectional view of the disc 3 shown in FIG. 13. FIGS. 2 and 3 show only the lines of the disc 3 appearing in the cross-section. FIGS. 2 and 3 also show a semiconductor substrate 2 placed on the disc 3 in the cross-section. The ion beam 1 is at a relatively fixed position in relation to the batch processing ion implantation apparatus or the floor on which the batch processing ion implantation apparatus is installed. The structure of the disc 3 will be described hereafter using the coordination system on the basis of the ion beam 1. It is assumed that the ion beam 1 travels in a horizontal plane. As shown in FIG. 2, the coordination system has a Z-axis in parallel to the ion beam 1 (in a horizontal plane) and directed oppositely to the traveling direction of the ion beam 1, a vertically upward Y-axis (upward on the sheet of FIG. 2), and an X-axis perpendicular to the Y-Z plane (the sheet surface in FIG. 2) constituted by the Y-axis and Z-axis and directed from the back to front of the sheet of FIG. 2. In FIG. 3, the X-axis is directed to the left and the Y-axis is perpendicular to the sheet surface and directed from the back to front of the sheet.

As shown by the solid lines in FIGS. 2 and 3, the disc 3 has an outer edge part raised at an angle of $\psi$ (hereafter, referred to as a cone angle $\psi$) in relation to a rotation plane 32 of the disc 3. This outer edge part is a mounting surface 33 for the semiconductor substrates 2. With the mounting surface 33 being angled, the semiconductor substrates 2 are pressed against the disc 3 by centrifugal force when the disc 3 rotates at a high speed.

As shown in FIG. 2, the disc 3 rotates about an axis 51 passing through a center 31 of the disc 3 (hereafter, referred to as a disc center 31) and parallel to the X-axis so that the rotation plane 32 of the disc 3 can be tilted in relation to the X-Y plane (the plane constituted by the X-axis and Y-axis). Furthermore, as shown in FIG. 3, the disc 3 rotates an axis 52 passing through the disc center 31 and parallel to the Y-axis so that the disc 3 can be tilted in relation to the X-Y plane.

When multiple semiconductor substrates 2 are mounted on the disc 3, first, as shown by the solid line in FIG. 2, the rotation plane 32 of the disc 3 is rotated about the axis 51 and tilted to the cone angle $\psi$ in relation to the X-Y plane. Then, the ion beam 1 enters the surface of the semiconductor substrate 2 at a right angle. Here, the rotation plane 32 of the disc 3 is perpendicular to the Z-Y plane (the plane constituted by the Z-axis and Y-axis) as shown by the solid line in FIG. 3.

Then, the disc 3 starts rotating in the circumferential direction at a high speed. During the high speed rotation, as shown by the broken line in FIG. 2, the rotation plane 32 of the disc 3 is rotated about the axis 51 and tilted to make a specific inclination $\alpha$ between the mounting surface 33 (or the surface of the semiconductor substrate 2 at the uppermost position) and the X-Y plane. Meanwhile, the rotation plane 32 of the disc 3 is rotated about the axis 52 and tilted to make a specific inclination $\beta$ between the rotation plane 32 and the X-Y plane.

In this way, the tilt angle $\gamma$ of the ion beam 1 in relation to the semiconductor substrate is set for a specific angle. Then, in this state, the ion beam 1 is emitted. The rotation plane 32 of the disc 3 moves along with the drive mechanism for rotating the disc 3 at a high speed such as a motor. Therefore, even if the tilt angle $\gamma$ is set for a specific angle, the disc 3 can rotate about the disc rotation axis passing through the disc center 31 and perpendicular to the rotation plane 32 at a high speed.

Figure 4:
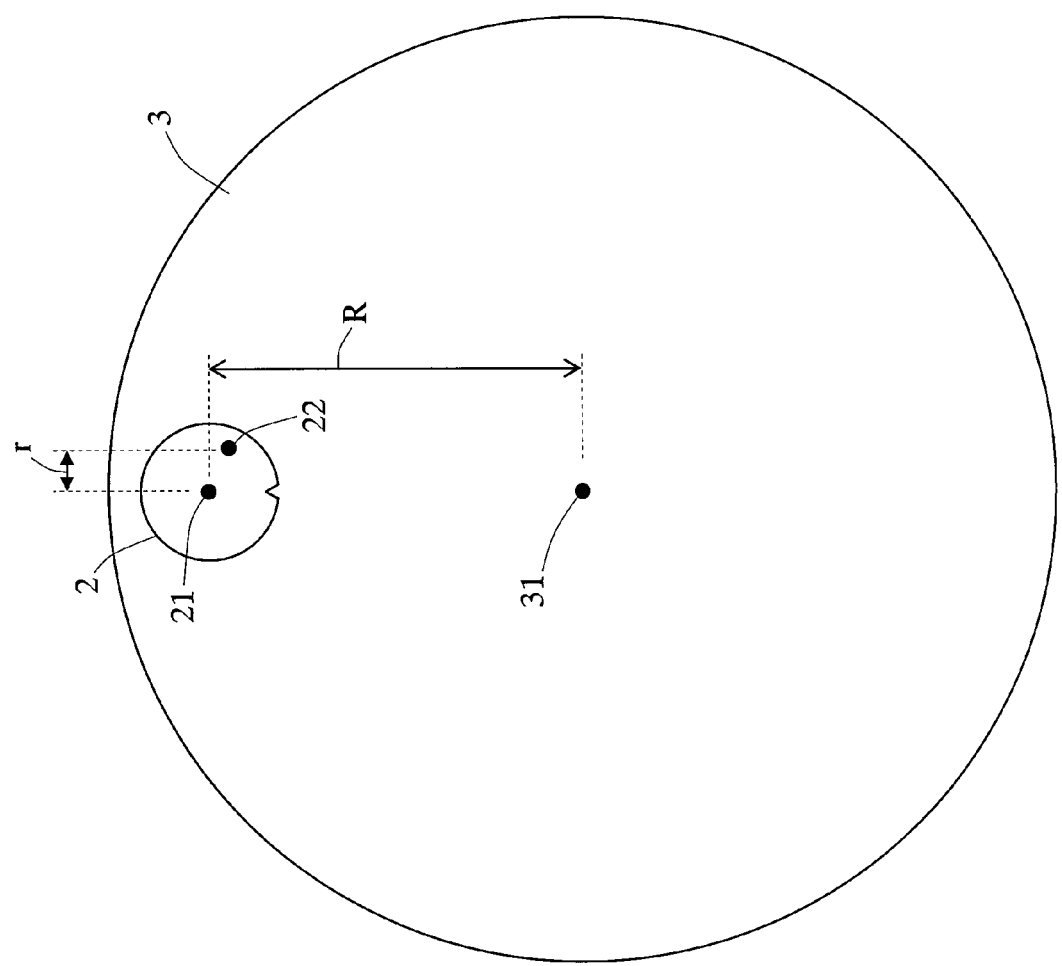
FIG. 4 is a schematic illustration showing a positional relationship between a disc and a semiconductor substrate.

The tilt angle $\gamma$ and twist angle $\theta$ of the ion beam 1 at any point on the semiconductor substrate 2 while the disc 3 rotates at a high speed are expressed by the following equations (1) to (5). Here, as shown in FIG. 4, an argument R is the distance between the disc center 31 and the center 21 of the semiconductor substrate 2 and an argument r is the horizontal distance between the center 21 of the semiconductor substrate 2 and any point 22.

$$\gamma = \cos^{-1}[\cos(\alpha-\psi)\cos\beta\cos\psi + \sin\beta\sin\psi\sin\phi - \sin(\alpha-\psi)\cos\beta\sin\psi\cos\phi] \quad (1)$$

$$\theta = \tan^{-1}(k/h) \quad (2)$$

$$k = \sin\beta\cos\phi + \sin(\alpha-\psi)\cos\beta\sin\phi \quad (3)$$

$$h = \cos(\alpha-\psi)\cos\beta\sin\psi + \sin(\alpha-\psi)\cos\beta\cos\psi\cos\phi - \sin\beta\cos\psi\sin\phi \quad (4)$$

$$\phi = \tan^{-1}(r/R) \quad (b\ 5)$$

As shown in the equations (1) to (5), the tilt angle γ and twist angle θ are expressed as functions of the horizontal distance r between the center 21 of the semiconductor substrate 2 and any point 22. Therefore, when the inclinations α and β are constant (except for the case α=ψ and β=0), the tilt angle γ and twist angle θ vary according to the position on the semiconductor substrate 2.

When the disc 3 rotates at a constant high speed, the circumferential velocity on the disc 3 is larger as the distance from the disc center 31 is increased. Therefore, when the circumferential velocity on the disc 3 changes according to the position on the semiconductor substrate 2, the ion beam 1 has different relative speeds across the semiconductor substrate 2 depending on the position on the semiconductor substrate 2. In such a case, the amount of impurity ions introduced in the semiconductor substrate 2 varies, failing to implant impurity ions uniformly throughout the entire surface of the semiconductor substrate 2. For this reason, the rotation speed of the disc 3 is changed according to the distance between the disc center 31 and the irradiation point of the ion beam 1 so as to create an equal circumferential velocity at the irradiation point of the ion beam 1. Similarly, the linear reciprocal movement (vertical movement in this case) of the disc 3 is changed according to the distance between the disc center 31 and the irradiation point of the ion beam 1 so as to create an equal relative moving speed of the ion beam 1. For example, when the semiconductor substrate 2 has a diameter of 200 mm, the disc 3 has a variable rotation speed ranging approximately from 200 to 1,215 rpm. The disc 3 has a variable vertical moving speed ranging approximately from 20 to 40 mm/sec. The amplitude of the vertical movement is approximately 250 mm. The ion beam 1 has a beam diameter of approximately 30 mm.

In the batch processing ion implantation apparatus having the above structure, the well boundary (PN junction) between N and P wells formed in the semiconductor region below the STI structure 26 is asymmetric in the prior art. This asymmetric boundary causes variation or decrease in the well-to-well breakdown voltage.

Figure 5:
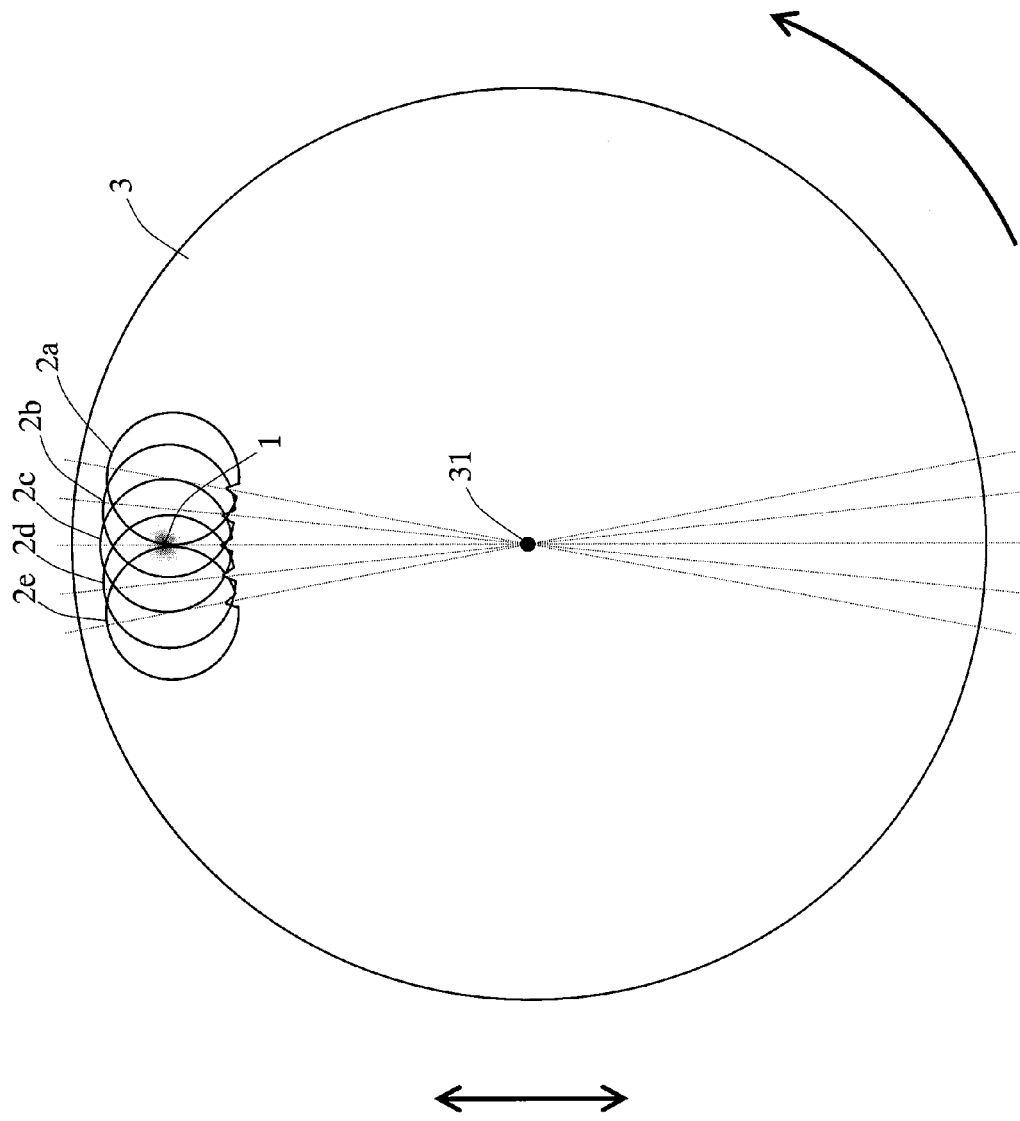
FIG. 5 is a schematic illustration showing a disc rotating at a high speed.
Figure 6:
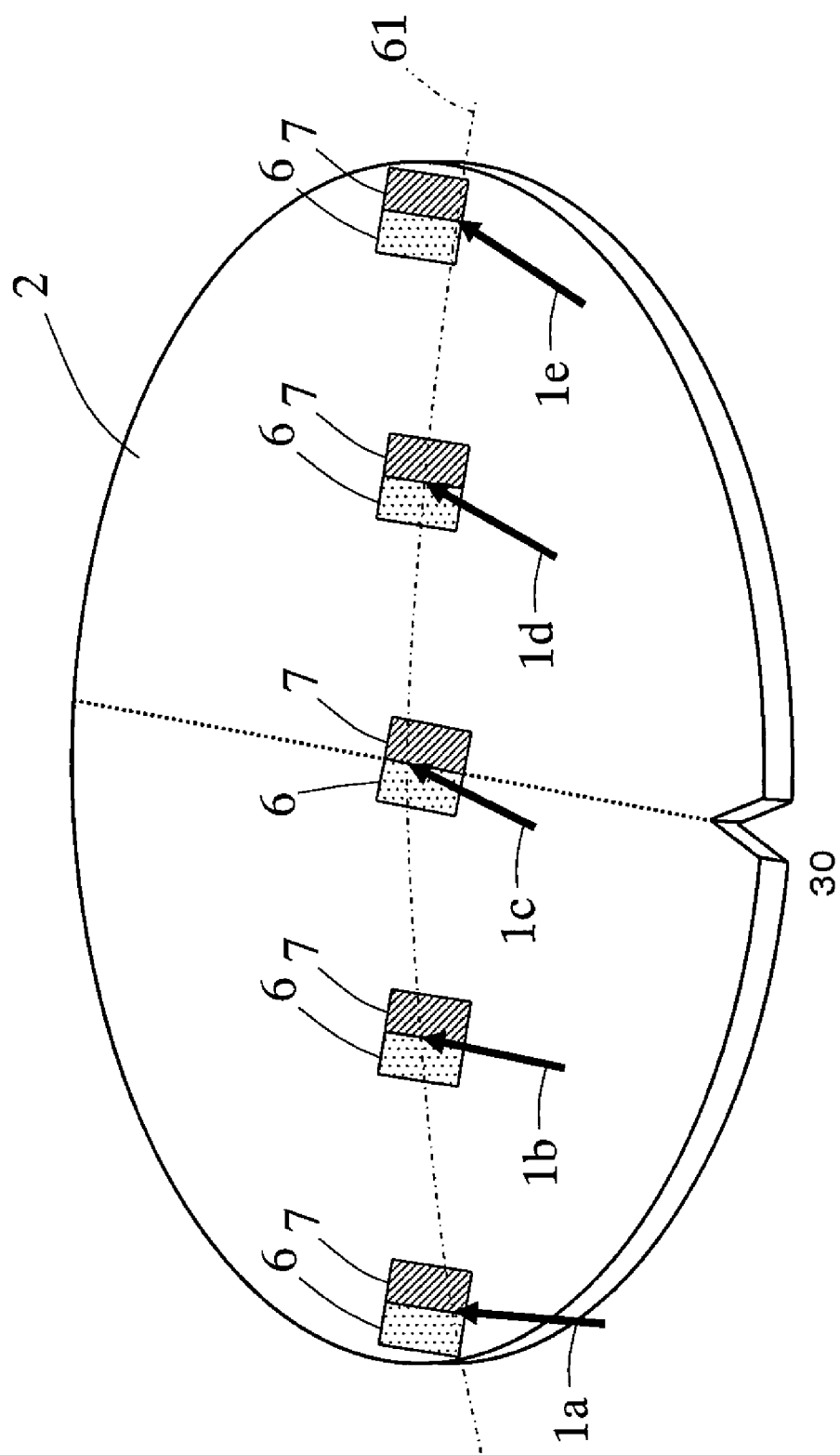
FIG. 6 is a schematic illustration showing an ion beam injection direction while a disc rotates at a high speed.
Figure 7C:
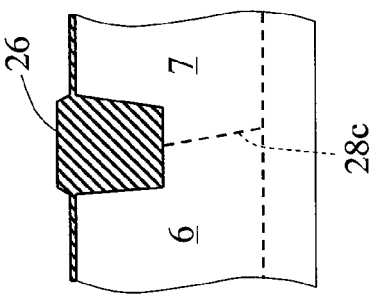
FIGS. 7A to 7E are cross-sectional views showing well boundaries formed at different positions on a semiconductor substrate.
Figure 7B:
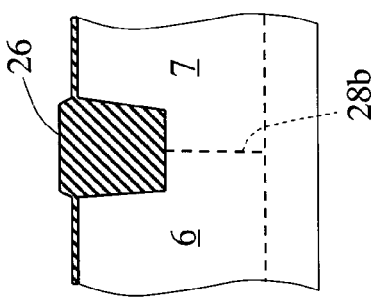
Figure 7E:
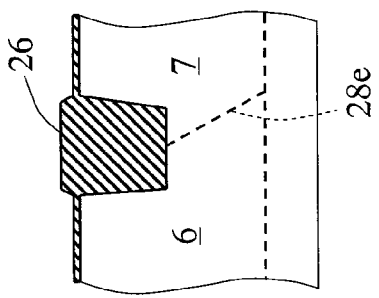
Figure 7A:
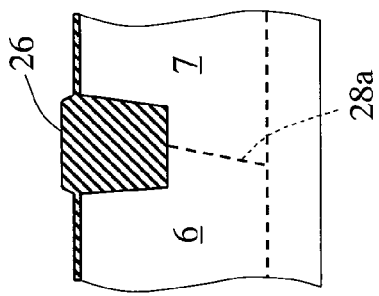
Figure 7D:
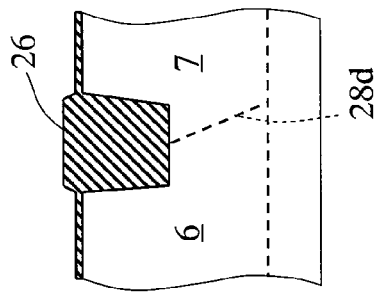

FIG. 5 is a schematic illustration showing the disc 3 rotating about the disc center 31 counterclockwise at a high speed. In FIG. 5, semiconductor substrates 2a, 2b, 2c, 2d, and 2e present a single semiconductor substrate 2 moving as the disc 3 rotates. FIG. 6 is an illustration showing the injection direction of the ion beam 1 to the semiconductor substrates 2a to 2e on the basis of the semiconductor substrate 2. In FIG. 6, ion beams 1a, 1b, 1c, 1d, and 1e present the injection directions of the ion beam 1 to the semiconductor substrates 2a to 2e shown in FIG. 5, respectively. For example, the ion beam 1 corresponding to the semiconductor substrate 2a in FIG. 5 is the ion beam 1a in FIG. 6. Here, it is assumed that the disc 3 does not move vertically while the semiconductor substrate 2 moves from the position of the semiconductor substrate 2a to the position of the semiconductor substrate 2e in FIG. 5.

As shown in FIG. 5, the semiconductor substrate 2 is irradiated with the ion beam 1 from the left end to the right end as the disc 3 rotates. The trajectory of the ion beam 1 on the semiconductor substrate 2 is in the form of an arc 61 shown by a dash-dot line in FIG. 6. The ion beam 1 enters the semiconductor substrate 2 at a specific angle to the arc 61.

For example, it is assumed that multiple sets of N and P wells 6 and 7 having the well boundary parallel to the line connecting the semiconductor substrate center 21 and notch 30 are formed in the direction perpendicular to that line. FIG. 6 shows five well boundaries (five sets of N and P wells 6 and 7) corresponding to the ion beams 1a to 1e. The ion beam 1 enters the semiconductor substrate 2 at a specific angle to the arc 61; the ion bean 1 does not enter the N well forming positions (or the P well forming positions) in the same direction as shown in FIG. 6. In other words, the ion beam 1 has a twist angle θ that varies according to the position on the semiconductor substrate 2.

FIGS. 7A to 7E are cross-sectional views showing the well boundaries formed on the semiconductor substrate 2 corresponding to the ion beams 1a to 1e shown in FIG. 6. FIGS. 7A to 7E correspond to the ion beams 1a to 1e, respectively. As shown in FIGS. 7A to 7E, only when the ion beam 1 enters in the direction parallel to the well boundary (FIG. 7B corresponding to the ion beam 1b), the well boundary 28b is symmetric about the STI structure 26. In the other cases, the well boundaries 28a, 28c, 28d, and 28e are asymmetric about the STI structure 26.

The asymmetric well boundary 28 (28a and 28c to 28e) created as described above causes variation or decrease in the well-to-well breakdown voltage. The present invention is made based on the above described findings.

EMBODIMENT

An embodiment of the present invention will be described hereafter with reference to the drawings. Here, the present invention is realized in forming N and P wells in a CMOS semiconductor integrated circuit.

First, an element isolation region is formed on the surface of a semiconductor substrate (a silicon substrate in this case) by a known technique as in the structure shown in FIG. 15A. In this embodiment, the element isolation region is an STI structure 26 formed by a known technique. The STI structure 26 has a depth of approximately 0.2 to 0.5 μm. This embodiment uses a silicon oxide film as the insulating material filled in the trench although this is not restrictive. The surface of the silicon oxide film is smoothed for example by CMP.

Then, a mask pattern for forming an N well is formed on the semiconductor substrate. The mask pattern can be a resist mask pattern formed by a known photolithography. Here, a resist pattern 4 having an opening over the N well forming region is formed as in FIG. 15A. The P well forming region is covered with the resist pattern 4. The opening edge of the resist pattern 4 is positioned on the STI structure 26. Here, the opening edge of the resist pattern 4 is positioned at the center 27 of the STI structure 26 in the width direction (the transverse direction of the figure). The resist pattern 4 has a thickness of approximately 1.0 to 1.5 μm.

Multiple semiconductor substrates 2 having the N well forming mask pattern 4 are mounted on the disc 3 of the batch processing ion implantation apparatus in an annular form around the disc center 31 as shown in FIG. 13. Then, N type impurity ions such as phosphorus ions are implanted at an implantation energy level of approximately 100 KeV to 1 MeV in the batch processing ion implantation apparatus under the following conditions.

FIG. 8A is an illustration showing the state of the disc 3 during the ion implantation. In FIG. 8A, the ion beam 1 is emitted to the center 21 of any of the semiconductor substrates 2 mounted on the disc 3. Here, the distance R between the disc center 31 and the semiconductor substrate center 21 is 445 mm. The semiconductor substrate 2 has a diameter of 200 mm. The disc 3 has a cone angle ψ of 5°. Each semiconductor substrate 2 is placed on the disc 3 with a notch angle of +45°. The notch angle is an angle between the line passing through the semiconductor substrate center 21 and disc center 31 and the line passing through the semiconductor substrate center 21 and notch 30. The notch angle is 0° when the notch 30 is directed to the disc center 31 and the notch angle is positive in the clockwise direction in FIG. 13.

In this state, the disc 3 is rotated about the disc rotation axis 53 and N type impurity ions are implanted. Here, the inclination α is set for a specific angle $\alpha_1$ that is nearly zero and the inclination β is set for a first angle $\beta_1$. Here, $\alpha_1=0°$ and $\beta_1=7°$. In such a case, the ion beam 1 enters the semiconductor substrate 2 at a tilt angle γ and twist angle θ determined by the equations (1) to (5). The inclination α is 0° when a cross-section parallel to the Y-Z plane (the plane constituted by the Y-axis and Z-axis) of the rotation plane 32 is parallel to the X-Y plane and the inclination α is positive in the counterclockwise direction in FIG. 2. The inclination β is 0° when a cross-section parallel to the Z-X plane of the rotation plane 32 is parallel to the X-Y plane and the inclination β is positive in the counterclockwise direction in FIG. 3.

When the ion implantation is completed, the inclination β is changed to a second angle $\beta_2$ that is different from the first angle $\beta_1$. In other words, as shown in FIG. 8B, the disc 3 is rotated about the axis 52 and the rotation plane 32 is at a symmetric position to the state when the inclination $\beta=\beta_1$ (the state in FIG. 8A) about the Y-Z plane. The Y-Z plane is a plane constituted by the Y-axis and Z-axis, namely a plane containing the ion beam 1 and disc center 31. When the first angle $\beta_1$ is 7°, the second angle $\beta_2$ is $-\beta_1=-7°$. In this state, the disc 3 is rotated about the disc rotation axis 53 and the same amount of N type impurity ions as in the ion implantation with $\beta=\beta_1$ is implanted into the semiconductor substrate 2. Here, the disc 3 is not rotated about the axis 51 (see FIG. 2). In other words, the inclination α is $\alpha_1$.

After the N well 6 is formed as described above, the semiconductor substrate 2 is removed from the ion implantation apparatus. Then, the N well forming resist pattern 4 is removed.

After the N well forming resist pattern 4 is removed, a mask pattern for forming a P well is formed. This mask pattern can be a resist pattern formed by a known photolithography like the N well forming mask pattern. Here, as in FIG. 15B, a resist pattern 5 having an opening over the P well forming region is formed. The N well forming region is covered with the resist pattern 5. The opening edge of the resist pattern 5 is positioned on the STI structure 26. Here, the opening edge of the resist pattern is positioned at the center 27 of the element isolation region in the width direction. The resist pattern 5 has a thickness of approximately 1.0 to 1.5 μm.

Multiple semiconductor substrates 2 having the P well forming resist pattern 5 as described above are mounted on the disc 3 of the batch processing ion implantation apparatus in an annular form around the disc center 31 with a notch angle of +45°. Then, P type impurity ions such as boron ions are implanted at an implantation energy level of approximately 100 KeV to 1 MeV in the batch processing ion implantation apparatus under the following conditions.

First, as shown in FIG. 8A, the inclination cc is set for the above specific angle $\alpha_1$ and the inclination β is set for the above first angle $\beta_1$. In this state, the disc 3 is rotated about the disc rotation axis 53 and P type impurity ions are implanted. When the ion implantation is completed, the rotation plane 32 of the disc 3 is rotated about the axis 52 and the inclination β is set for the above second angle $\beta_2$ ($=-\beta_1$). In this state, the disc 3 is rotated about the disc rotation axis 53 and the same amount of P type impurity ions as in the ion implantation with the inclination $\beta=\beta_1$ is implanted in the semiconductor substrate 2. Here, the disc 3 is not rotated about the axis 51 and the inclination a is the above specific angle $\alpha_1$.

In the above case, N type impurity ions are first implanted and then P type impurity ions are implanted. The sequence is not particularly restrictive. P type impurity ions can first be implanted and then N type impurity ions can be implanted. The dose of each type of impurity ions is determined so that the N and P wells 6 and 7 or the impurity layers formed in the semiconductor substrate 2 have the same impurity concentration.

FIG. 9 is a plane view of a semiconductor substrate schematically showing the N and P wells 6 and 7 formed by the above well forming method. In FIG. 9, the N and P wells 6 and 7 formed at the center of the semiconductor substrate 2 and on either side thereof are shown in an enlarged view. In the above well forming method, the N type impurity ions and P type impurity ions are injected in different directions. Therefore, a compensation region as shown in FIGS. 16A to 16C is formed at the well boundary 20. Then, the center of the compensation region 13 is assumed to be the well boundary 20 in FIG. 9. Furthermore, in FIG. 9, the STI structure 26 present above the well boundary 20 (20a to 20c) is not shown. As described above, the notch angle of the semiconductor substrate 2 during the ion implantation is set for +45°. In FIG. 9, the well boundary 20 is parallel to the line passing through the semiconductor substrate center 21 and notch 30. Therefore, the well boundary 20 has an angle of 45° in relation to the line passing through the semiconductor substrate center 21 and disc center 31.

In FIG. 9, solid line arrows 71 present the projected line of the injection direction of N type impurity ions on the semiconductor substrate 2 and broken line arrows 72 present the projected line of the injection direction of P type impurity ions on the semiconductor substrate 2. More precisely, although the solid line arrows 71 and broken line arrows 72 overlap, they are shown in parallel in FIG. 9 for explanation.

As shown in FIG. 9, the ion beam 1 enters at nearly the same angle in relation to the well boundary 20 in the above ion implantation method. This is obvious by comparing the twist angle θ at a specific distance r calculated with α=0°, β=7°, ψ=5°, and R=445 mm with the twist angle θ at a specific distance r calculated with α=0°, β=−7°, ψ=5°, and R=445 mm.

As described above, the semiconductor substrate 2 rotates about the disc center 31 as the rotation axis. The projected lines 71 and 72 are oriented differently at the positions of the well boundaries 20a, 20b, and 20c. Therefore, if the ion implantation is performed once each for N and P wells 6 and 7 without changing the inclination P of the disc 3 as in the prior art, the well boundary is shifted according to the position on the semiconductor substrate 2.

Conversely, in this embodiment, the N type impurity ion implantation is performed with the inclination $\beta=\beta_1$ (or $\beta=\beta_2$) and the P type impurity ion implantation is performed with the inclination $\beta=\beta_2=-\beta_1$ (or $\beta=\beta_1$). Thus, in at least one ion implantation, N type impurity ions and P type impurity ions are implanted with the rotation plane 32 of the disc 3 at symmetric directions about the plane containing the ion beam 1 and disc center 31. Then, as shown in FIG. 9, the projected line 71 of the injection direction of N type impurity ions and the projected line 72 of the injection direction of P type impurity ions are in opposite directions to each other. Consequently, the well boundary 20 (20a to 20c) symmetric about the STI structure 26 can be formed regardless of the position on the semiconductor substrate 2.

Figure 10A:
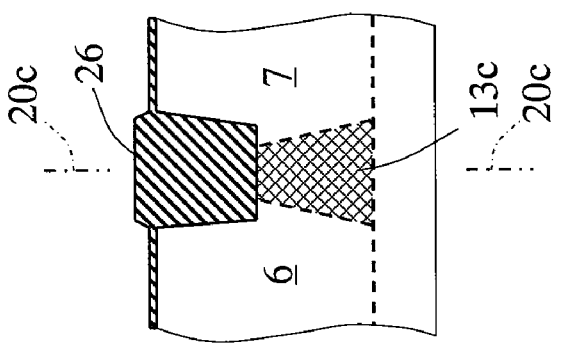
FIGS. 10A to 10C are cross-sectional views showing well boundaries formed in an embodiment of the present invention.
Figure 10B:
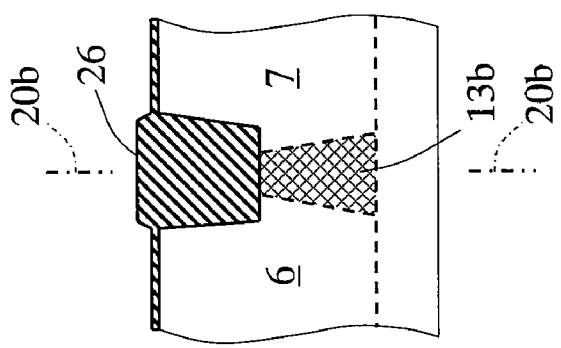
Figure 10C:
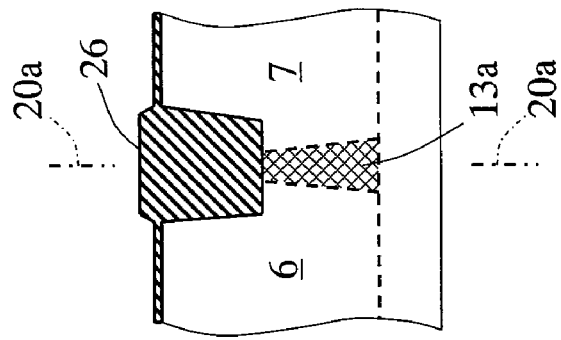
Figure 14:
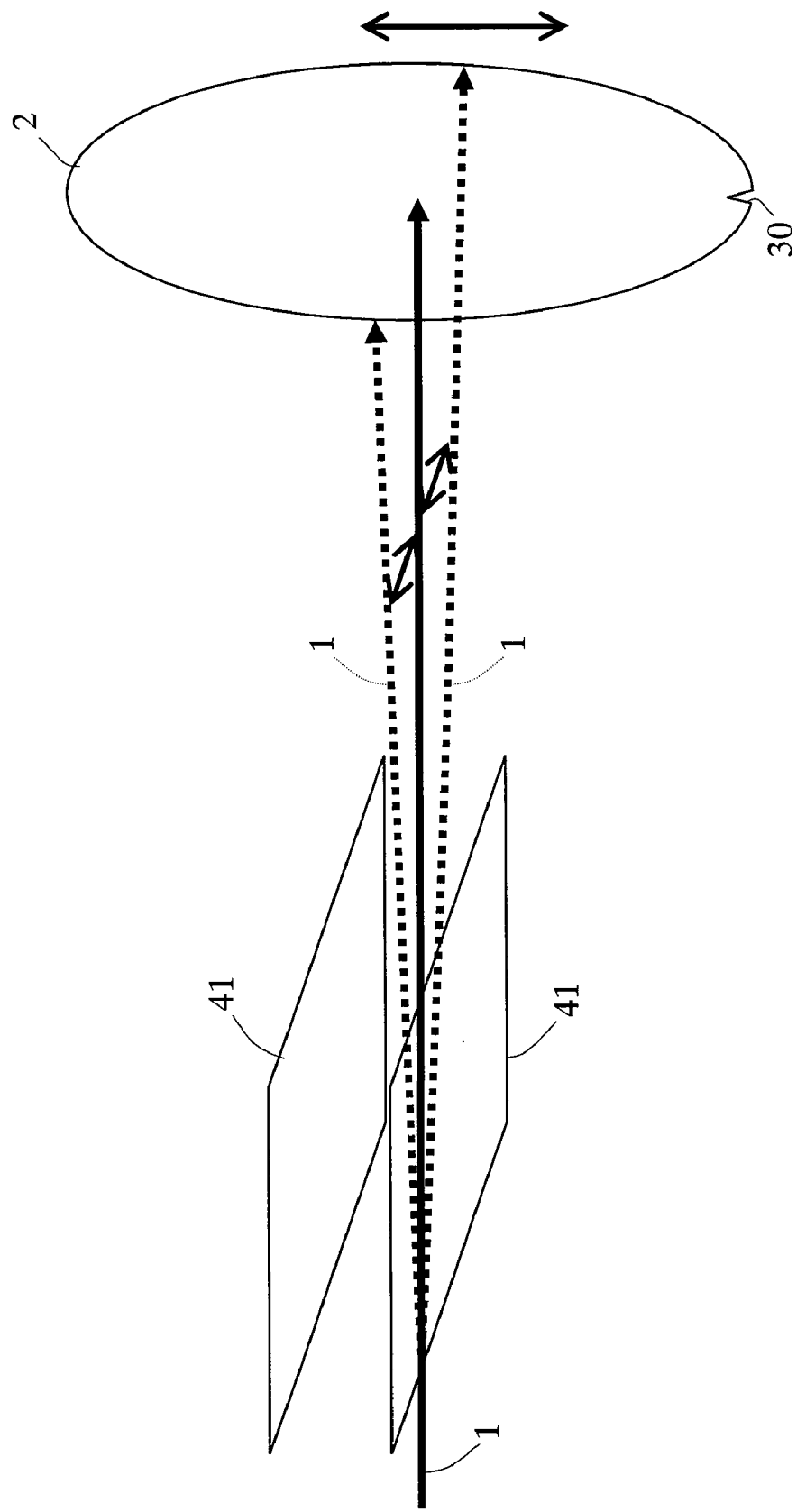
FIG. 14 is an illustration showing a positional relationship between an ion beam and semiconductor substrate in a single wafer processing ion implantation apparatus.

FIGS. 10A to 10C are cross-sectional views showing the structure below the STI structure 26 corresponding to the well boundaries 20a to 20c shown in FIG. 9. As described above, a compensation region 13 (13a to 13c) is formed at the well boundary 20 (20a to 20c) shown in FIG. 9. In this embodiment, the injection direction of N type impurity ions and the injection direction of P type impurity ions vary according to the position on the semiconductor substrate 2. Therefore, the formed compensation regions 13a to 13c have different widths (the width in the transverse direction in FIGS. 10A to 10C) depending on their position on the semiconductor substrate 2. However, in this embodiment, because N type impurity ions and P type impurity ions are injected in nearly opposite directions to each other, the compensation region 13 (13a to 13c) formed between the N and P wells 6 and 7 is symmetric about the well boundary 20 (20a to 20c). Consequently, a nearly uniform well-to-well breakdown voltage can be obtained regardless of the position on the semiconductor substrate 2. As decrease in the well-to-well breakdown voltage depending on the position on the semiconductor substrate 2 is prevented, the well-to-well breakdown voltage can be improved.

In this embodiment, as shown in FIG. 9, both N type impurity ion implantation and P type impurity ion implantation are performed with the inclination $\beta=\beta_1$ and $\beta=\beta_2$. N type impurity ions and P type impurity ions are different ion species. Therefore, the compensation region 13 has a technically different form between the case that the N well 6 is formed on the left and the P well 7 is formed on the right (as in FIGS. 10A to 10C) and the case that the P well 7 is formed on the left and the N well 6 is formed on the right even if it is formed at the same position on the semiconductor substrate 2. Then, the well boundary may possibly be slightly asymmetric. However, as in this embodiment, N type impurity ion implantation and P type impurity ion implantation are performed with the rotation plane 32 of the disc 3 being at positions symmetric about the Y-Z plane, preventing the above asymmetric formation. Where the asymmetric formation due to different ion species implanted is not an issue with the property of a desired semiconductor device, the N type impurity ion implantation with the inclination $\beta=\beta_1$ and the P type impurity ion implantation with the inclination $\beta=\beta_2$ can each be performed once. Then, a compensation region 13 nearly symmetric about the STI structure 26 can be formed.

FIGS. 11A and 11B are graphical representations showing the distribution of well-to-well breakdown voltage of the well boundary formed by the well forming method of this embodiment and the distribution of well-to-well breakdown voltage of the well boundary formed by the prior art method. FIG. 11A shows the well-to-well breakdown voltage of this embodiment and FIG. 11B shows the prior art well-to-well breakdown voltage. In FIGS. 11A and 11B, the well-to-well breakdown voltage is plotted as abscissa and the cumulative frequency (%) of each breakdown voltage is plotted as ordinate. FIG. 12 is a plane view showing a measuring pattern used to obtain the distributions of well-to-well breakdown voltage shown in FIGS. 11A and 11B. The measuring pattern 81 consisted of patterns L (data presented by circles in FIGS. 11A and 11B) and R (data presented by triangles in FIGS. 11A and 11B) having two well boundaries parallel to the line passing through the center 21 and notch 30 of the semiconductor substrate 2 and patterns U (data presented by squares in FIGS. 11A and 11B) and D (data presented by rhombuses in FIGS. 11A and 11B) having a well boundary perpendicular to that line. The patterns L and R had N and P wells at reversed positions. Similarly, the patterns U and D had N and P wells at reversed positions. This measuring pattern was formed on the entire surface of the semiconductor substrate 2. The well-to-well breakdown voltage of each pattern was measured. The measurements are shown in FIGS. 11A and 11B. The well-to-well breakdown voltage is defined as a potential difference at which a specific leak current (1 μA per 1 μm length of the well boundary in FIGS. 11A and 11B) flows when a reverse bias is applied to the well boundary formed below the STI structure 26.

As shown in FIG. 11B, in the prior art, the well-to-well breakdown voltage is significantly different depending on the well boundary forming direction and the positional relationship between N and P wells. The well-to-well breakdown voltage tends to be lower in the patterns having the well boundary perpendicular to the line passing through the semiconductor substrate center 21 and notch 30 (the patterns U and D) than in the patterns having the well boundary parallel to that line (the patterns L and R). Particularly, the pattern U has a lower well-to-well breakdown voltage than the other patterns along with larger variation in the breakdown voltage values. Conversely, in the well forming method of this embodiment shown in FIG. 11A, all patterns have nearly the same well-to-well breakdown voltage and high well-to-well breakdown voltages. Furthermore, variation in the well-to-well breakdown voltage values is reduced.

The well-to-well breakdown voltage of the well boundary formed by the prior art method is subject to larger variation as the element isolation region has a smaller width. Particularly, when the element isolation region has a width of 130 nm or smaller, variation in the well-to-well breakdown voltage is apparent and significantly affects the semiconductor integrated circuit property. Therefore, the present invention has a significant effect on the resolution of the above problem with the future 65 nm, 45 nm, and 32 nm nodes processing technique.

As described above, in the present invention, when N and P wells are formed below an element isolation region, a well boundary symmetric in relation to the element isolation region can easily be formed. Consequently, variation in the well-to-well breakdown voltage can be reduced and a high well-to-well breakdown voltage can be realized.

The present invention is not confined to the above described embodiment. Various modifications and applications are available within the scope of the effect of the present invention. For example, in the above embodiment, ion implantation is performed on a silicon substrate with the first angle $\beta_1=7°$ for preventing channeling that occurs because of the single crystal lattice geometry of the silicon substrate. The first angle $\beta_1$ is not restricted to 7°. It is preferable that $3°\leq\beta_1\leq10°$; however, any finite angle in a range of $0°<\beta_1<90°$ can be used. Furthermore, in the above description, the second angle $\beta_2=-\beta_1$. It is not essential that the absolute values of $\beta_2$ and $\beta_1$ are absolutely equal. They can be different values within a range yielding the above effect. In addition, the same effect can be obtained with a notch angle of +135°, +225°, or +315°. In such a case, it is preferable that the well boundary is formed in parallel to or perpendicularly to the line passing through the notch and semiconductor substrate center.

The present invention has the effect that deterioration in the well-to-well breakdown voltage is prevented in the batch processing ion implantation apparatus and provides a useful ion implantation method for producing, for example, CMOS transistors.

What is claimed is:

1. A semiconductor device manufacturing method for emitting an ion beam to form impurity layers in multiple semiconductor substrates while a plate-shape support on which multiple semiconductor substrates are mounted in an annular form around a rotation center is rotated about the rotation center, comprising the steps of:

forming a first mask pattern having an opening over a region in which a first impurity layer is formed on the multiple semiconductor substrates having an element isolation region consisting of an insulation material and the opening edge positioned on the element isolation region;

emitting an ion beam to implant a first conductivity type impurity in the multiple semiconductor substrates while the support on which multiple semiconductor substrates each having the first mask pattern are mounted is positioned in a manner that a first angle is made between a plane perpendicular to an ion beam injection direction and a line perpendicular to a line passing through an ion beam irradiation point and the rotation center in a rotation plane of the support and rotated about the rotation center;

forming a second mask pattern having an opening over a region in which a second impurity layer is formed on the multiple semiconductor substrates and the opening edge positioned on the element isolation region;

emitting an ion beam to implant a second conductivity type, which is the conductivity type opposite to the first conductivity type, impurity in the multiple semiconductor substrates while the support on which multiple semiconductor substrates each having the second mask pattern are mounted is positioned in a manner that a second angle is made between the plane perpendicular to the ion beam injection direction and the line perpendicular to the line passing through the ion beam irradiation point and the rotation center in the rotation plane of the support and rotated about the rotation center;

emitting an ion beam to implant the first conductivity type impurity in the multiple semiconductor substrates while the support on which multiple semiconductor substrates each having the first mask pattern are mounted is positioned in a manner that the second angle is made between the plane perpendicular to the ion beam injection direction and the line perpendicular to the line passing through the ion beam irradiation point and the rotation center in the rotation plane of the support and rotated about the rotation center; and emitting an ion beam to implant the second conductivity type impurity in the multiple semiconductor substrates while the support on which multiple semiconductor substrate each having the second mask pattern are mounted is positioned in a manner that the first angle is made between the plane perpendicular to the ion beam injection direction and the line perpendicular to the line passing through the ion beam irradiation point and the rotation center in the rotation plane of the support and rotated about the rotation center.

2. A semiconductor device manufacturing method according to claim 1, wherein the first and second angles are angles at which the rotation plane of the support is positioned symmetrically about the plane containing the ion beam and the rotation center.

3. A semiconductor device manufacturing method according to claim 1, wherein the first and second impurity layers are wells.

4. A semiconductor device manufacturing method according to claim 1, wherein each semiconductor substrate is mounted on the support in a manner that an angle of 45° is made between a line passing through a center and notch of the semiconductor substrate and a line passing through the center of the semiconductor substrate and the rotation center of the support.

5. A semiconductor device manufacturing method according to claim 4, wherein a boundary between the first and second impurity layers formed on the semiconductor substrate surface is parallel to or perpendicular to a line passing through the center and notch of the semiconductor substrate.

6. A semiconductor device manufacturing method according to claim 1, wherein the element isolation region has a width of 130 nm or smaller in the direction perpendicular to a boundary between the first and second impurity layers.

7. A semiconductor device manufacturing method for emitting an ion beam to form impurity layers in multiple semiconductor substrates while a plate-shape support on which multiple semiconductor substrates are mounted in an annular form around a rotation center is rotated about the rotation center, comprising the steps of:

forming a first mask pattern having an opening over a region in which a first impurity layer is formed on the multiple semiconductor substrates having an element isolation region consisting of an insulation material and the opening edge positioned on the element isolation region;

emitting an ion beam to implant a first conductivity type impurity in the multiple semiconductor substrates while the support on which multiple semiconductor substrates each having the first mask pattern are mounted is positioned in a manner that a first angle is made between a plane perpendicular to an ion beam injection direction and a line perpendicular to a line passing through an ion beam irradiation point and the rotation center in a rotation plane of the support and rotated about the rotation center;

forming a second mask pattern having an opening over a region in which a second impurity layer is formed on the multiple semiconductor substrates and the opening edge positioned on the element isolation region; and emitting an ion beam to implant a second conductivity type, which is the conductivity type opposite to the first conductivity type, impurity in the multiple semiconductor substrates while the support on which multiple semiconductor substrates each having the second mask pattern are mounted is positioned in a manner that a second angle is made between the plane perpendicular to the ion beam injection direction and the line perpendicular to the line passing through the ion beam irradiation point and the rotation center in the rotation plane of the support and rotated about the rotation center;

wherein each semiconductor substrate is mounted on the support in a manner that an angle of 45° is made between a line passing through a center and notch of the semiconductor substrate and a line passing through the center of the semiconductor substrate and the rotation center of the support.

8. A semiconductor device manufacturing method according to claim 7, wherein the first and second angles are angles at which the rotation plane of the support is positioned symmetrically about the plane containing the ion beam and the rotation center.

9. A semiconductor device manufacturing method according to claim 7, wherein the first and second impurity layers are wells.

10. A semiconductor device manufacturing method according to claim 7, wherein a boundary between the first and second impurity layers formed on the semiconductor substrate surface is parallel to or perpendicular to a line passing through the center and notch of the semiconductor substrate.

11. A semiconductor device manufacturing method according to claim 8, wherein a boundary between the first and second impurity layers formed on the semiconductor substrate surface is parallel to or perpendicular to a line passing through the center and notch of the semiconductor substrate.

12. A semiconductor device manufacturing method according to claim 9, wherein a boundary between the first and second impurity layers formed on the semiconductor substrate surface is parallel to or perpendicular to a line passing through the center and notch of the semiconductor substrate.

13. A semiconductor device manufacturing method according to claim 7, wherein the element isolation region has a width of 130 nm or smaller in the direction perpendicular to a boundary between the first and second impurity layers.

14. A semiconductor device manufacturing method according to claim 10, wherein the element isolation region has a width of 130 nm or smaller in the direction perpendicular to a boundary between the first and second impurity layers.

* * * * *